(12) United States Patent
Chen

(10) Patent No.: US 8,803,611 B2
(45) Date of Patent: Aug. 12, 2014

(54) CURRENT MODE LOGIC CIRCUIT AND METHOD

(75) Inventor: Wei Chih Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/588,830

(22) Filed: Aug. 17, 2012

(65) Prior Publication Data

US 2014/0028394 A1    Jan. 30, 2014

Related U.S. Application Data

(60) Provisional application No. 61/677,304, filed on Jul. 30, 2012.

(51) Int. Cl.
*H03F 3/45*    (2006.01)
(52) U.S. Cl.
USPC .......................................... 330/261; 330/260
(58) Field of Classification Search
USPC .................................. 330/260, 261, 257, 253
See application file for complete search history.

(56) References Cited

U.S. PATENT DOCUMENTS

| 3,643,173 | A  | * | 2/1972  | Whitten ........................ 330/253 |
| 4,301,421 | A  | * | 11/1981 | Yokoyama .................... 330/253 |
| 5,493,253 | A  | * | 2/1996  | Ogou ............................ 330/256 |
| 5,530,403 | A  | * | 6/1996  | Bushman et al. ............. 330/253 |
| 7,262,652 | B2 | * | 8/2007  | Omori et al. .................. 327/538 |
| 7,262,664 | B1 | * | 8/2007  | Joffe et al. .................... 330/260 |
| 8,274,320 | B2 | * | 9/2012  | Hsu et al. ...................... 327/356 |

* cited by examiner

*Primary Examiner* — Henry Choe
(74) *Attorney, Agent, or Firm* — Slater and Matsil, L.L.P.

(57) ABSTRACT

A circuit includes a bias generating circuit, an operational amplifier, and a current mode logic circuit. The operational amplifier has a first input terminal, a second input terminal, and an output terminal. The bias generating circuit is configured to provide a first bias voltage to the first terminal. The second terminal is configured to receive a second bias voltage. The second terminal and the output terminal are configured to form a negative feedback loop. The output terminal is coupled with the current mode logic circuit.

20 Claims, 3 Drawing Sheets

CURRENT MODE LOGIC CIRCUIT AND METHOD

This application claims the benefit of U.S. Provisional Application No. 61/677,304, filed Jul. 30, 2012 entitled, "Common Mode Logic Circuit and Method" which application is hereby incorporated herein by reference.

TECHNICAL FIELD

The present disclosure is related to a current mode logic circuit and related method.

BACKGROUND

Some integrated circuits include both core transistors and input-output (IO) transistors. Core transistors are smaller, occupy less die space, and use lower voltage level signals and a lower supply voltage value. Core transistors operate in a core supply voltage domain. In contrast, IO transistors are larger, occupy a larger die space, and use higher voltage level signals and a higher supply voltage value. IO transistors operate in an IO supply voltage domain. Gate oxides of core transistors are generally thin compared with those of IO transistors. Consequently, core transistors are also called thin oxide or thin transistors while IO transistors are called thick oxide or thick transistors.

For illustration, a condition in which a P-type metal oxide semiconductor (PMOS) transistor and an N-type metal oxide semiconductor (NMOS) transistor have fast responses compared with normal transistors is called a FF condition or a FF corner. In contrast, a condition in which a PMOS transistor and an NMOS transistor have slow responses compared with normal transistors is called an SS condition or an SS corner.

In circuit applications such as in the universal serial bus 3.0 (USB 3.0), peripheral component interconnect express (PCIE) third generation, and the Thunderbolt, serializer/deserializer (SERDES) circuits often use an equalizer and a current mode logic (CML) buffer to amplify received signals. In some existing approaches, a core voltage supply value is used to obtain speed and bandwidth requirements. The CML circuit comprises a resistor and a tail current. The output swing of the amplified signal is based on the tail current and a resistance of the resistor. As a result, the output swing is affected by variations of the tail current and of the resistor with reference to temperature under which the circuits operate.

In some approaches, a precision current mirror circuit having two metal oxide semiconductor (MOS) transistors provides high output impedance, and reduces channel modulation effect of the MOS transistors to minimize the current mirror mismatch. In short channel processes, however, the supply voltage is under 1 V. To get high accuracy for the current mirror, four MOS transistors and one resistor are used in one branch of the differential pair, which results in a low headroom limitation because of the low supply voltage under 1.0 V. In some other approaches, three MOS transistors are used in one branch, which, however, results in a large current mismatch.

In at least two approaches that require a precision current, a large current mismatch results from current mirrors in the circuit. Other deficiencies also exist. For example, in one approach, the voltage swing of an output signal is small in the FF corner. A resistance variation of the SS corner is as high as two times a resistance variation of the FF corner. To obtain a larger output swing at the FF corner, a size of the resistor is increased. In such a condition, however, the resistance of the resistor limits the bandwidth at the SS corner. Further, to keep a transistor operating in the saturation region, the tail current requires a large voltage drop between the drain and the source of the transistor.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION OF ILLUSTRATIVE EMBODIMENTS

Figure 1:
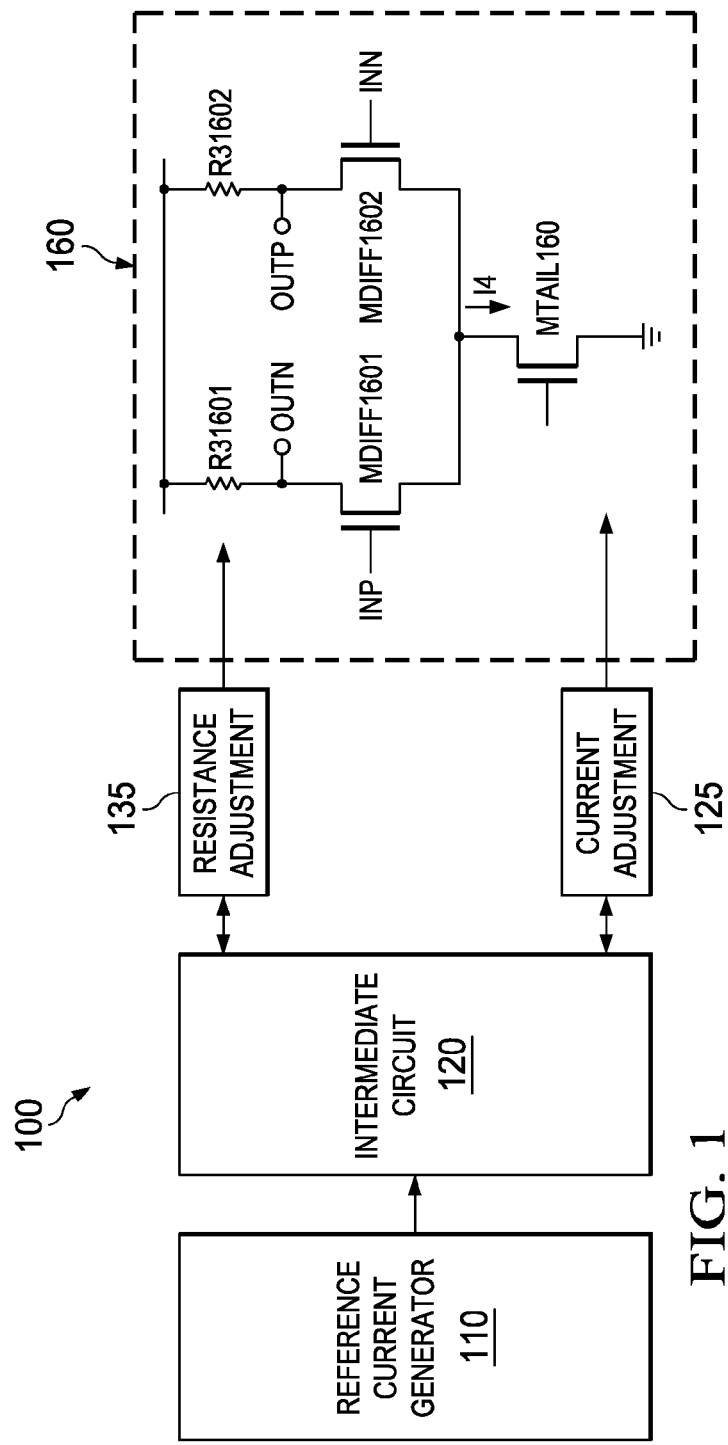
FIG. 1 is a block diagram of a circuit using a current mode logic circuit (CML), in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a constant voltage drop is achieved between a supply voltage and a resistor of a current mode logic circuit (CML) that uses core transistors with a supply voltage of less than 1 V. The constant voltage is independent of a current mismatch and resistance variations in the circuit. In a core supply voltage domain, cascade metal oxide semiconductor (MOS) transistors are not used. A current mismatch between a reference current and a mirrored current of the CML circuit is within an acceptable range.

In data communications, a speed of about 10 Giga bits per second is considered a high speed. Various embodiments of the disclosure are applicable to high speed circuits that use many core transistors, such as in the designs of the USB 3.0, the PCIE third generation, the serial AT attachment (SATA) III and the Thunderbolt circuits.

In some embodiments, a supply voltage value of about 1.0 V or less is considered a low supply voltage and thus a low headroom. In some embodiments, the headroom limitation is overcome, even when the supply voltage is under 1.0 V. As a result, various embodiments are applicable to low supply voltage and low headroom applications, such as in the deep sub-micron short channel processes.

Various embodiments are also applicable to applications in which one circuit is used to provide a bias voltage to other circuits in different locations such as in the PCIE series and USB 3.0 hub applications. Output swings of the circuits, however, remain at the same value in the different locations. In some embodiments, the output swing is almost constant.

Exemplary Circuits Having a Current Mode Logic

FIG. 1 is a block diagram of a circuit 100, in accordance with some embodiments. Circuit 100 includes a reference current generator 110, an intermediate circuit 120, a resistance adjustment 135, a current adjustment 125, and a current mode logic circuit (CML) 160. For simplicity, a reference name is used to refer to both a node or a line and a signal or a voltage thereon. For example, a reference name VDDIO is used to refer to both a voltage supply node and a supply voltage on the node.

Reference current generator 110 generates a reference current, which, in some embodiments, is constant. Based on variations of currents in circuit 100 with reference to the reference current, intermediate circuit 120, together with current adjustment 125, adjusts the currents. Similarly, based on variations of resistance in circuit 100, intermediate circuit 120, together with resistance adjustment 135, adjusts the resistance. In some embodiments, the adjusted current and resistance are stabilized based on a negative feedback loop of intermediate circuit 120. Current mode logic circuit 160, based on the adjusted current and resistance, provides a constant voltage swing at outputs OUTN and OUTP. Details of circuits 110, 120, 125, 135, and 160 are explained with reference to FIG. 2.

Figure 2:
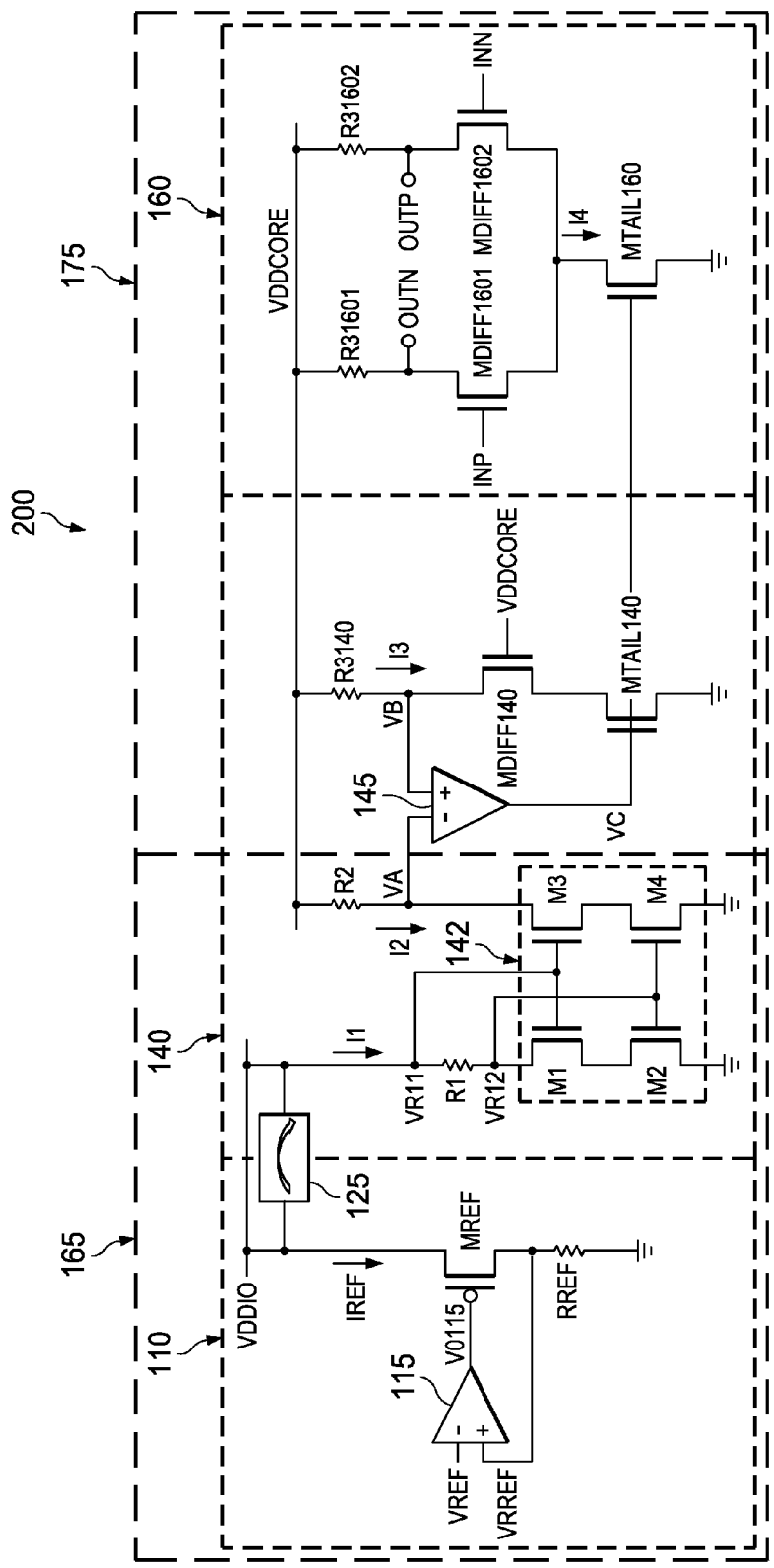
FIG. 2 is a diagram of a circuit having implementations of sub-circuits of the circuit in FIG. 1, in accordance with some embodiments.

FIG. 2 is a diagram of a circuit 200, in accordance with some embodiments. Circuit 200 is an embodiment of circuit 100 in FIG. 1. In circuit 200, a constant voltage bias 140 performs the functions of intermediate circuit 120, current adjustment 125, and resistance adjustment 135.

In some existing approaches, resistance values of resistors corresponding to resistors R2, R3140, R31601 and R31602 are supposed to be the same. The resistance values in those approaches, however, vary depending on different operational temperatures at different locations of resistors R2, R3140, R31601 and R31602. As a result, a voltage swing of circuit outputs in those approaches corresponding to outputs OUTN and OUTP varies with respect to temperature variations. In various embodiments of the present disclosure, the effects of variations of resistors R2, R3140, R31601 and R31602 are minimized or eliminated. For example, variations of resistors R2, R3140, R31601 and R31602 are compensated to result in outputs OUTN and OUTP having a constant voltage swing.

Reference current generator 110 operates in a VDDIO domain. For example, a source of a PMOS transistor MREF receives a voltage VDDIO. An operational amplifier (OP-AMP) 115 has a negative input terminal, a positive input terminal, and an output terminal having an output voltage VO115. The negative input terminal receives a reference voltage VREF, which, in some embodiments, is from a bandgap reference circuit (not shown). As a result, voltage VREF is independent of temperature variations. The positive input terminal of OP-AMP 115 receives a feedback signal VRREF at a drain of transistor MREF coupled to one end of a reference resistor RREF. In some embodiments, transistor MREF is a PMOS thick transistor. A current IREF flows from supply voltage node VDDIO through a source and a drain of transistor MREF.

Mathematically, $$IREF = VRREF/RREF$$

OP-AMP 115 and transistor MREF form a negative feedback loop to keep current IREF at a constant level. For example, when voltage VRREF increases, voltage VO115 at the output terminal of OP-AMP 115 decreases, which causes current IREF to decrease. As a result, voltage VRREF at an end of resistor RREF decreases. Effectively, voltage VRREF maintains at a constant voltage value. In other words, OP-AMP 115 stabilizes voltages VO115 and voltage VRREF. As a result, voltage VO115 and current IREFF maintain at a corresponding constant level.

A current mirror 125 mirrors current IREF to a current I1. In the supply voltage domain VDDIO, the difference between current IREF and current I1 is within an acceptable range, such as about 100 µA. For simplicity, a first current is called "matched" with a second current when a current difference between the first current and the second current is within a predetermined range. Alternatively stated, there is no mismatch between the first current and the second current or the first and the second currents are substantially the same. For example, current I1 is matched with current IREF or currents I1 and IREF are substantially the same when the current difference between currents IREF and I1 is within 100 µA. Different circuits implemented as current mirror 125 are within the scope of various embodiments. Current mirror 125 is shown as part of reference current generator 110 for illustration. Other locations of current mirror 125 are within the scope of various embodiments.

A first part of constant voltage bias 140 uses supply voltage VDDIO. For example, a node VR11 at one end of resistor R1 receives voltage VDDIO. In contrast, a second part of circuit 140 uses a supply voltage VDDCORE. For example, one end of resistors R2 and R3140 each receives voltage VDDCORE. In some embodiments, voltage VDDIO is about 1.8 V, 2.5 V, or 3.3 V, while voltage VDDCORE is about 0.9 V.

Constant voltage bias 140 includes a current mirror 142, an OP-AMP 145, transistors MDIFF140 and MTAIL140, and resistors R1, R2, and R3140.

Current mirror 142 is formed by NMOS transistors M1, M2, M3, and M4. Effectively, current mirror 142 is formed by a first pair of transistors M1 and M3 and a second pair of transistor M2 and M4. Two pairs of transistors including the first pair of transistors comprising transistors M1 and M3 and a second pair of transistors comprising transistors M2 and M4 are shown for illustration. A different number of pairs of transistors forming current mirror 142 are within the scope of various embodiments. Current mirror 142 mirrors current I1 to a current I2. In some embodiments, a difference between current I1 and current I2 is within a predetermined range such as about 1% difference. In other words, there is no mismatch between currents I1 and I2 when the difference between current I1 and current I2 is about 1% or less.

Resistor R1 provides a corresponding bias voltage for the first pair of transistors comprising transistors M1 ad M3 and the second pair of transistors comprising transistors M2 and M4. For example, voltage VR11 at one end of resistor R1 is used to bias gates of transistors M1 and M3, and voltage VR12 at another end of resistor R1 is used to bias gates of transistors M2 and M4.

In some embodiments, current mirror 125 mirrors current IREF to current I1 and current mirror 142 mirrors current I1 to current I2 so that transistors M3 and M4 have enough headroom. For example, if current mirror 125 directly mirrors current IREF to current I2 without current mirror 142 mirroring current I1 to current I2, transistors M3 and M4 may face a headroom limitation because of the low voltage of VDDCORE provided to transistor M3 through resistor R2.

In some embodiments, transistors M1, M2, M3, and M4 are thick transistors. In contrast, transistors MTAIL140 and MFIFF140 are thin transistors.

Voltages VA, VB, and VC are at a negative input terminal, a positive input terminal, and an output terminal of OP-AMP 145, respectively. OP-AMP 145, together with transistors MDIFF140 and MTAIL140, functions as a current mirror mirroring current I2 to current I3. In some embodiments, currents I2 and I3 are substantially the same when a current difference between currents I2 and I3 is within a predetermined and acceptable range, such as about 1% difference In some embodiments, voltages VA and VB are as low as 0.3 V while voltage VDDCORE is under 1.0 V, such as 0.9 V.

OP-AMP 145, transistor MTAIL140, and transistor MDIFF140 form a negative feedback loop to keep voltage VB at a constant level. For example, when voltage VB at the positive input terminal of OP-AMP145 increases, voltage VC at the output terminal decreases. Current I3 therefore increases, and a voltage drop across transistor R3140 increases. As a result, voltage VB at one end of resistor R3140 decreases. Effectively, when voltage VB increases, the negative feedback loop causes voltage VB to decrease. In other words, voltage VB is maintained at a constant level. Both Voltage VB and VA are called a bias voltage for OP-AMP 145.

Voltage VC at the output terminal of the OP-AMP 145 is received at each gate of transistor MTAIL140 and transistor MTAIL 160 of CML 160. Effectively, voltage VC is used to control CML 160. For example, if voltage VC is logically low, transistor MTAIL160 and thus CML 160 are turned off because CML 160 functions as an open circuit. In contrast, when voltage VC is logically high, transistor MTAIL160 and thus CML 160 are turned on because transistor MTAIL160 serves as a current path for CML 160.

Constant voltage bias 140 is also called a constant voltage drop circuit because, in some embodiments, voltage VA is voltage VDDCORE dropped by a voltage VR2 (not labeled) dropped across resistor R2 and voltage VB is voltage VDDCORE dropped by a voltage VR3140 (not labeled) dropped across resistor R3140. By operation of OP-AMP 145 and the negative feedback loop, each of voltages VR2 and VR3140 is constant independent of variations of current I2, a resistance of resistor R2, current I3, and a resistance of resistor R3140. For example, because voltage VA equals voltage VB, voltage VR2 equals voltage VR3140. Effectively, if the resistance of resistor R2 equals the resistance of resistor R3140, current I2 is forced to be equal to current I3. But if the resistance of resistor R2 is different from that of resistor R3140, at least one of current I2 or current I3 is adjusted such that voltage VA equals voltage VB and voltage VR2 equals voltage VR3140. Explained in a different way, OP-AMP 145 and the negative feedback loop adjust one or a combination of the resistance of resistor R2, the resistance of resistor R3140, current I2, and current I3 so that voltages VA and VB are equal. Effectively, constant voltage bias 140 via OP-AMP 145 performs the functions of current adjustment 125 and resistance adjustment 135 in FIG. 1.

Current mode logic circuit (CML) 160 operates in the VDDCORE domain. For example, one end of each of resistors R31601 and R31602 receives voltage VDDCORE. Resistors R31601 and R31602 are thin resistors. A transistor MTAIL160 functions as a current sink.

Inputs of CML 160 comprise signals INP and INN received by gates of transistors MDIFF1601 and MDIFF1602, respectively. Outputs of CML 160 comprise signals OUTP and OUTN at sources of transistors MDIFF1602 and MDIFF1601, respectively.

In some embodiments, one circuit branch of CML 160 is active at a time. For example, when voltage INP is greater than voltage INN, transistor MDIFF1601 is turned on while transistor MDIFF1602 is turned off. A current I4 flows from node VDDCORE through resistor R31601, transistor MDIFF1601, and transistor MTAIL160. Output OUTN is therefore logically high. In contrast, when voltage INN is greater than voltage INP, transistor MDIFF1602 is turned on while transistor MDIFF1601 is turned off. Current I4 flows from node VDDCORE through resistor R31602, transistor MDIFF1602, and transistor MTAIL160. Output OUTP is therefore logically high.

Each circuit branch of CML 160 is designed to imitate the branch of constant bias voltage 140 that comprises resistor R3140, transistor MDIFF140, and transistor MTAIL140. For example, the first circuit branch of CML 160 comprises resistor R31601, transistor MDIFF1601, and transistor MTAIL160 wherein resistances of resistors R3140 and R31601 are substantially the same, sizes and architectures of transistors MDIFF140 and MDIFF1601 are the substantially the same, and sizes and architectures of transistors MTAIL140 and MTAIL1601 are substantially the same. Similarly, the second circuit branch of CML 160 comprises resistor R31602, transistor MDIFF1602, and transistor MTAIL160 wherein resistances of resistors R3140 and R31602 are substantially the same, sizes and architectures of transistors MDIFF140 and MDIFF1602 are the substantially the same, and sizes and architectures of transistors MTAIL140 and MTAIL1602 are substantially the same. Because one branch of CML 160 is active at a time, current I4 equals current I3.

CML 160 generates outputs OUTN and OUTP such that an output swing between outputs OUTN and OUTP is independent of temperature variations. In some embodiments, transistors MDIFF1601, MDIFF1602, and MTAIL140 are core transistors. CML 160 is therefore also called a core transistor CML. In some embodiments, each of transistors MDIFF1601 and MDIF1602 operates with a voltage VDS of about 0.15 V wherein voltage VDS is a voltage drop across a drain and a source of a transistor. Further, transistor MTAIL160 operates with a voltage VDS of about 0.15 V. Additionally, an output swing of outputs OUTN and OUTP is about 0.5 V when voltage VDDCORE is about 0.9 V. For illustration, R(RREF), R(R2), R(R3140), R(R31601), and R(R3102) represent resistances of corresponding resistors RREF, R2, R3140, R31601, and R31602.

Mathematically, $$R(RREF)=R(R2)=R(R3140)=R(R31601)=R(R31602)$$

$$VR2=VRREF$$

$$VREF=VRREF$$

$$IREF=I1=I2=VREF/RREF$$

$$VA=VDDCORE-VREF$$

$$VB=VA$$

When input INP is logically low and input INN is logically high $$OUTP=VDDCORE \text{ and } OUTN=VDDCORE-(I4*R(R31601))$$

From the above equations $$OUTP-OUTN=(I4*R(R31601))=VREF$$

Further, when input INN is logically low and input INP is logically high $$OUTN=VDDCORE \text{ and } OUTP=VDDCORE-(I4*R(R31602))$$

As a result, $$OUTN-OUTP=(I4*R(R31602))=VREF$$

Because voltage VREF is independent of temperature variations, each of (OUTP−OUTN) and (OUTN−OUTP) is independent of temperature. In other words, the voltage swing of outputs OUTP and OUTN is independent of temperature.

Resistors R2, R3140, R31601, and R31602 having the same resistance value as that of reference resistor RREF is for illustration. Different resistance values of resistors R2, R3140, R31601, and R31602 are within the scope of various embodiments. For example, in some embodiments, the resistance of at least one of resistors R2, R3140, R31601, and R31602 is a scaled version of the resistance of resistor RREF. In such a situation, corresponding voltages are adjusted accordingly.

In some embodiments, a circuit 165 as shown in FIG. 2 is at a first location in a system using circuit 100 while one or more of circuit 175 is at other locations in the same system. Circuit 165 is also called a voltage bias generator because circuit 165 provides voltage VA based on which voltage VB in circuit 175 is adjusted. In some embodiments, one circuit 165 provides voltage VA to about 128 circuits 175 at different locations. Other numbers of circuits 175 at different locations are within the scope of various embodiments.

Separate locations of circuit 165 and circuits 175 have different temperatures. Various embodiments of the disclosure, however, minimize effects of the temperature differences or temperature variations at different locations. For example, in some embodiments related to the PCIE and USB hub applications, voltage VA in circuit 165 is provided to the negative input terminals of OP-AMP 145 in circuits 175 in different locations. In various embodiments, the negative feedback loop of OP-AMP 145 causes voltage VB to be equal to be voltage VA. Effectively, voltages VB in different circuits 175 in different locations of the system are of the same value. As a result, output swings of outputs OUTN and OUTP at different locations remain the same constant value.

Various embodiments of the present disclosure are advantageous. For example, OP-AMP 145 and the feedback loop comprising transistors MTAIL140 and MDIFF140 function as a current mirror mirroring current I2 to current I3 and provide better accuracy than other ways to mirror current I2 to current I3. Further, current I3 equals to current I4 in various embodiments of the present disclosure. In contrast, in some existing approaches current I4 is mismatched with current I3. For another example, in some embodiments, because the voltage swing of outputs OUTN and OUTP is constant, the bandwidth of circuit 100 remains the same. In contrast with some existing approaches in which the bandwidth is degraded when the voltage swing of outputs OUTN and OUTP changes.

Exemplary Method

Figure 3:
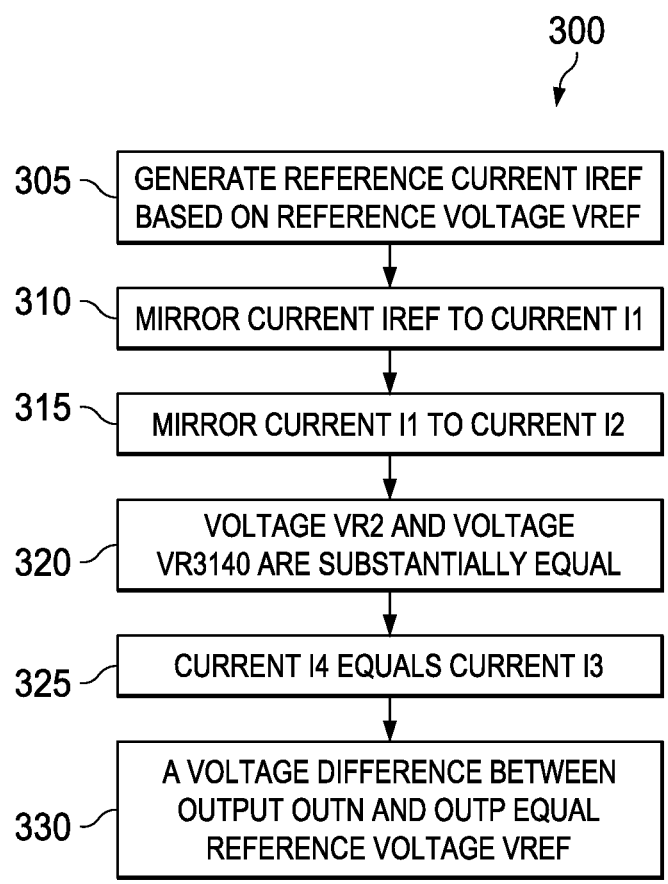
FIG. 3 is a flowchart of a method of operating the circuit in FIG. 2, in accordance with some embodiments.

FIG. 3 is a flowchart of a method 300 of operating circuit 200 in FIG. 2, in accordance with some embodiments.

In operation 305, reference current generator 110 generates current IREF based on reference voltage VREF.

In operation 310, current mirror 125 minors current IREF to current I1.

In operation 315, current mirror 142 minors current I1 to current I2.

In operation 320, OP-AMP 145 keeps voltage VA and VB to be substantially the same based on the feedback loop between the positive input terminal and the output of OP-AMP 145. Effectively, voltage VR2 from current I2 and resistance R(R2) and voltage VR3140 from current I3 and resistance R(R3) are substantially equal.

In operation 325, when either one circuit branch of CML 160 is active, current I4 from that branch is substantially equal to current I3.

In operation 330, a voltage swing between output OUTN and output OUTP is equal to reference voltage VREF based on relationships between the resistance of resistors R2, R3140, R31601, and R31602 of currents I2, I3, I4 as described above in various mathematical equations.

In some embodiments, a circuit comprises a bias generating circuit, an operational amplifier, and a current mode logic circuit. The operational amplifier has a first input terminal, a second input terminal, and an output terminal. The bias generating circuit is configured to provide a first bias voltage to the first terminal. The second terminal is configured to receive a second bias voltage. The second terminal and the output terminal are configured to form a negative feedback loop. The output terminal is coupled with the current mode logic circuit.

In some embodiments, a circuit comprises a current source, a first current minor, an adjustment circuit, and a current mode logic circuit. The current source is configured to provide a first current on a first current path. The adjustment circuit comprises a second current path coupled with a first input terminal of the adjustment circuit and a third current path coupled with the second input terminal of the adjustment circuit. The second current path comprises a first resistance value and a second current. The third current path comprises a second resistance value and a third current. The first current minor is configured to minor the first current to the second current. The adjustment circuit is configured to adjust at least one of the first resistance value, the second resistance value, the second current, or the third current such that a voltage at the first input terminal is substantially equal to a voltage at the second input terminal. A current path of the current mode logic circuit carries a current having a current value substantially equal to a current value of the third current.

In some embodiments, a circuit comprises a current source, a first current minor, a second current minor, an operational amplifier, a first resistive device, a second resistive device, a first transistor, and a current mode logic circuit. The current source is configured to generate a reference current. The first current mirror is configured to mirror the reference current to a first current. The second current mirror is configured to minor the first current to a second current flowing between a supply voltage node, the first resistive device, and a first terminal of the operational amplifier. The operational amplifier includes a third current flowing between the supply voltage node, the second resistive device, and a second terminal of the operational amplifier. The operational amplifier, the first transistor, and the second transistor are configured to form a feedback loop between the second terminal and an output terminal of the operational amplifier. An output of the operational amplifier is configured to control the current mode logic circuit.

A number of embodiments have been described. It will nevertheless be understood that various modifications may be made without departing from the spirit and scope of the disclosure. For example, various transistors being shown as a particular dopant type (e.g., N-type or P-type metal oxide semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular level when a signal is activated and/or deactivated. Selecting different levels is within the scope of various embodiments. In various embodiments, a transistor functions as a switch. A switching circuit used in place of a transistor is within the scope of various embodiments.

Various figures show discrete resistors for illustration. Equivalent circuitries may be used. For example, a resistive device, circuitry or network (e.g., a combination of resistors, resistive devices, circuitry, etc.) can be used in place of the resistor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
 a bias generating circuit;
 an operational amplifier having a first input terminal, a second input terminal, and an output terminal;
 a first resistive device and a second resistive device, wherein a first end of each first resistive device and second resistive device is configured to receive a supply voltage, resulting in a first current flowing through the first resistive device and the first input terminal and a second current flowing through the second resistive device and the second input terminal; and
 a current mode logic circuit,
 wherein
  the bias generating circuit is configured to provide a first bias voltage to the first terminal;
  the second input terminal is configured to receive a second bias voltage;
  the second input terminal and the output terminal are configured to form a negative feedback loop; and
  the output terminal is coupled with the current mode logic circuit.

2. The circuit of claim 1, wherein the circuit further comprises a first transistor;
 a first end of the first resistive device is configured to receive a supply voltage;
 a second end of the first resistive device is configured to receive the first bias voltage;
 a first end of the second resistive device is configured to receive the supply voltage;
 a second end of the second resistive device is configured to receive the second bias voltage; and
 the first transistor is coupled between the second input terminal and the output terminal, and is part of the feedback loop.

3. The circuit of claim 2, wherein
 the circuit further comprises a second transistor coupled between the second terminal and the first transistor.

4. The circuit of claim 1, wherein
 the operational amplifier is configured such that a voltage drop across the first resistive device is substantially equal to a voltage drop across the second resistive device.

5. The circuit of claim 1, wherein
 the operational amplifier is configured as a current minor to mirror the first current to the second current.

6. The circuit of claim 5 further comprising a first current mirror configured to minor a third current to the first current.

7. The circuit of claim 6, wherein
 the circuit further comprises a current generator and a second current minor;
 the current generator is configured to generate a reference current based on a reference voltage that does not change when a temperature changes; and
 the second current mirror is configured to mirror the reference current to the third current.

8. The circuit of claim 7 wherein
 a voltage difference between a first output of the current logic circuit and a second output of the current logic circuit is substantially equal to the reference voltage.

9. The circuit of claim 1, wherein
 a current path coupled with the second input terminal carries a first current;
 a current path of the current mode logic circuit carries a second current; and
 a current value of the first current is substantially equal to a current value of the second current.

10. The circuit of claim 1, wherein
 a current path coupled with the second input terminal comprises the first resistive device, a first transistor, and a second transistor;
 the first resistive device is coupled with the first transistor;
 the first transistor is coupled with the second transistor;
 a current path of the current logic circuit comprises the second resistive device, a third transistor, and a fourth transistor;
 the second resistive device is coupled with the third transistor;
 the third transistor is coupled with the fourth transistor;
 a resistance value of the first resistive device is substantially equal to a resistance value of the second resistive device;
 a size of the first transistor is substantially equal to a size of the third transistor; and
 a size of the second transistor is substantially equal to a size of the fourth transistor.

11. The circuit of claim 1, wherein
 the circuit further comprises the first resistive device coupled with the first input terminal and the second resistive device coupled with the second input terminal;
 the current logic circuit comprises a third resistive device coupled with a first output terminal of the current logic circuit and a fourth resistive device coupled with a second output terminal of the current logic circuit; and
 resistance values of the first resistive device, the second resistive device, the third resistive device, and the fourth resistive device are substantially equal.

12. The circuit of claim 1, wherein
 the operational amplifier and the current logic circuit form a sub-circuit;
 the circuit further comprises a plurality of sub-circuits; and
 the bias generating circuit is configured to provide the first bias voltage to a plurality of first terminals of a plurality of operational amplifiers of the plurality of sub-circuits.

13. A circuit comprising:
 a current source;
 a first current mirror;
 an adjustment circuit; and
 a current mode logic circuit,
 wherein
  the current source is configured to provide a first current on a first current path;
  the adjustment circuit comprises a second current path coupled with a first input terminal of the adjustment circuit and a third current path coupled with a second input terminal of the adjustment circuit;
  the second current path comprises a first resistance value and a second current;
  the third current path comprises a second resistance value and a third current;

the first current mirror is configured to mirror the first current to the second current;

the adjustment circuit is configured to adjust at least one of the first resistance value, the second resistance value, the second current, or the third current such that a voltage at the first input terminal is substantially equal to a voltage at the second input terminal; and a current path of the current mode logic circuit carries a current having a current value substantially equal to a current value of the third current.

14. The circuit of claim 13, wherein
the circuit further comprises a current generating circuit and a second current mirror;
the current generating circuit is configured to generate a reference current from a reference voltage;
the second mirror is configured to mirror the reference current to the first current; and
a voltage difference between a first output terminal of the current mode logic circuit and a second output terminal of the current mode logic circuit is substantially equal to the reference voltage.

15. The circuit of claim 13, wherein
the adjustment circuit comprises an operational amplifier having a first input terminal served as the first input terminal of the adjustment circuit and a second input terminal served as the second input terminal of the adjustment circuit.

16. A circuit comprising:
a current source;
a first current mirror;
a second current mirror;
an operational amplifier;
a first resistive device;
a second resistive device;
a first transistor; and
a current mode logic circuit,
wherein
the current source is configured to generate a reference current;
the first current mirror is configured to mirror the reference current to a first current;
the second current mirror is configured to mirror the first current to a second current flowing between a supply voltage node, the first resistive device, and a first terminal of the operational amplifier;
the operational amplifier includes a third current flowing between the supply voltage node, the second resistive device, and a second terminal of the operational amplifier;
the operational amplifier, the first transistor, and a second transistor are configured to form a feedback loop between the second terminal and an output terminal of the operational amplifier; and
an output of the operational amplifier is configured to control the current mode logic circuit.

17. The circuit of claim 16, wherein
the current mode logic circuit includes a first current mode logic resistive device in a first branch of the current mode logic circuit and a second current mode logic resistive device in a second branch of the current mode logic circuit; and
a resistance value of the first resistive device, a resistance value of the second resistive device, a resistance value of the first current mode logic resistive device, and a resistance value of the second current mode logic resistive device are substantially the same.

18. The circuit of claim 16, wherein
the circuit further comprises a current generating circuit configured to provide the reference current based on a reference voltage independent of a temperature change; and
a voltage difference between a first output terminal of the current mode logic circuit and a second output terminal of the current mode logic circuit is substantially equal to the reference voltage.

19. The circuit of claim 16, wherein
the current logic circuit comprises a current branch having a current value substantially equal to a current value of the third current.

20. The circuit of claim 1, wherein the bias generating circuit includes transistors with respective gate oxides having a first thickness, the current mode logic circuit includes transistors with respective gate oxides having a second thickness, and wherein the first thickness is greater than the second thickness.

* * * * *

UNITED STATES PATENT AND TRADEMARK OFFICE
CERTIFICATE OF CORRECTION

Page 1 of 1

PATENT NO. : 8,803,611 B2
APPLICATION NO. : 13/588830
DATED : August 12, 2014
INVENTOR(S) : Chen It is certified that error appears in the above-identified patent and that said Letters Patent is hereby corrected as shown below:

In the Claims

Col. 9, line 58, claim 5, delete "minor" and insert --mirror--.
Col. 9, line 61, claim 5, delete "minor" and insert --mirror--.
Col. 11, line 1, claim 13, delete "minor" and insert --mirror--.
Col. 11, line 13, claim 14, delete "minor;" and insert --mirror;--.
Col. 11, line 16, claim 14, delete "minor" and insert --mirror--.

Signed and Sealed this
Twenty-first Day of October, 2014

Michelle K. Lee
*Deputy Director of the United States Patent and Trademark Office*